(12) United States Patent
Tsujimoto et al.

(10) Patent No.: US 6,176,966 B1
(45) Date of Patent: Jan. 23, 2001

(54) METHOD OF DIE BONDING ELECTRONIC COMPONENT AND DIE BONDING APPARATUS THEREOF

(75) Inventors: Masaki Tsujimoto, Urawa; Kenji Kobayashi, Ohmiya, both of (JP)

(73) Assignee: Lintec Corporation (JP)

( * ) Notice: Under 35 U.S.C. 154(b), the term of this patent shall be extended for 0 days.

(21) Appl. No.: 09/095,739

(22) Filed: Jun. 11, 1998

(30) Foreign Application Priority Data

Jun. 12, 1997 (JP) .................................................... 9-155117

(51) Int. Cl.[7] .................................................... B32B 35/00
(52) U.S. Cl. .................. 156/344; 156/584; 29/426.3; 29/426.4; 29/426.5; 438/464
(58) Field of Search .................. 156/344, 584; 29/426.1, 426.3, 426.4, 426.5, 426.6; 438/464, 976, FOR 386

(56) References Cited

U.S. PATENT DOCUMENTS

| 4,921,564 | * | 5/1990 | Moore | 156/344 |
| 5,110,388 | | 5/1992 | Komiyama et al. | 156/229 |
| 5,316,853 | | 5/1994 | Shibata et al. | 428/416 |
| 5,411,921 | | 5/1995 | Negoro | 437/217 |
| 5,466,325 | | 11/1995 | Mizuno et al. | 156/344 |
| 5,525,422 | | 6/1996 | Spies et al. | 428/355 |
| 5,534,102 | * | 7/1996 | Kadono et al. | 156/344 X |
| 5,637,395 | | 6/1997 | Uemura et al. | 428/343 |
| 5,641,714 | * | 6/1997 | Yamanaka | 438/464 X |
| 5,824,177 | * | 10/1998 | Yoshihara et al. | 156/292 X |
| 5,824,185 | * | 10/1998 | Nakamura et al. | 156/584 |
| 5,827,394 | * | 10/1998 | Lu | 156/344 |

FOREIGN PATENT DOCUMENTS 0571649   5/1992   (EP) .

OTHER PUBLICATIONS

Japanese Publication No. 60–223139, Abstract, Nov. 7, 1985, 1 p., English language.

* cited by examiner

Primary Examiner—Mark A. Osele
(74) Attorney, Agent, or Firm—Webb Ziesenheim Logsdon Orkin & Hanson, P.C.

(57) ABSTRACT

A method of die bonding electronic components. A wafer is mounted on a dicing tape (17) comprising at least one layer of shrink film and a pressure sensitive adhesive layer so that the wafer is stuck thereto by the pressure sensitive adhesive layer. The wafer is then diced so that the wafer is cut apart into a multiplicity of chips (16). The dicing tape (17) having the multiplicity of chips stuck thereto is placed on a table equipped with heating means. This is followed by shrinking the shrink film forming part of the dicing tape by the heating means (3, 7) so that an area of adhesion and adhesive strength between the chips and the adhesive layer are decreased and so that the chips are arranged with predetermined spacings. The final step is suctioning the chips (16) arranged with predetermined spacings one at a time by a suction collet (19) disposed above the chips so that the chips are separated from each other. This method enables effective die bonding without damaging the chips. Apparatus for effecting the method is also provided.

14 Claims, 7 Drawing Sheets

METHOD OF DIE BONDING ELECTRONIC COMPONENT AND DIE BONDING APPARATUS THEREOF

FIELD OF THE INVENTION

The present invention relates to a method of die bonding electronic components and a die bonding apparatus therefor. More particularly, the present invention is concerned with a method of die bonding electronic components, which, in demounting chips from a dicing tape in the process for producing small electronic components such as semiconductor chips, enables suctioning of the chips one at a time so that these are separated from each other without the need to conduct the conventional push-up by means of pins and is also concerned with a die bonding apparatus therefor.

BACKGROUND OF THE INVENTION

Figure 9:
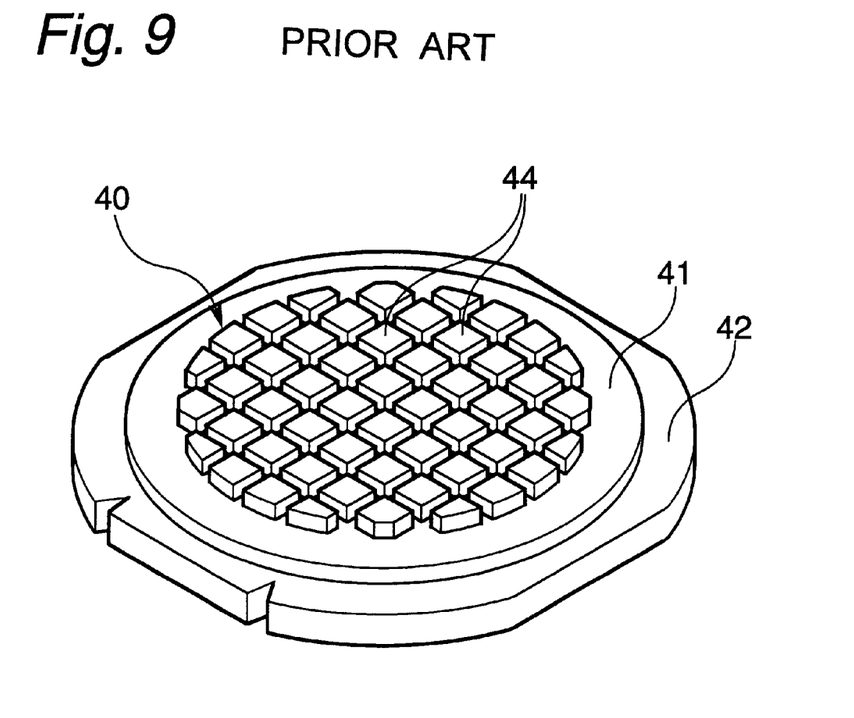
FIG. 9 is a perspective view showing the state of conventional semiconductor wafer diced.
Figure 10:
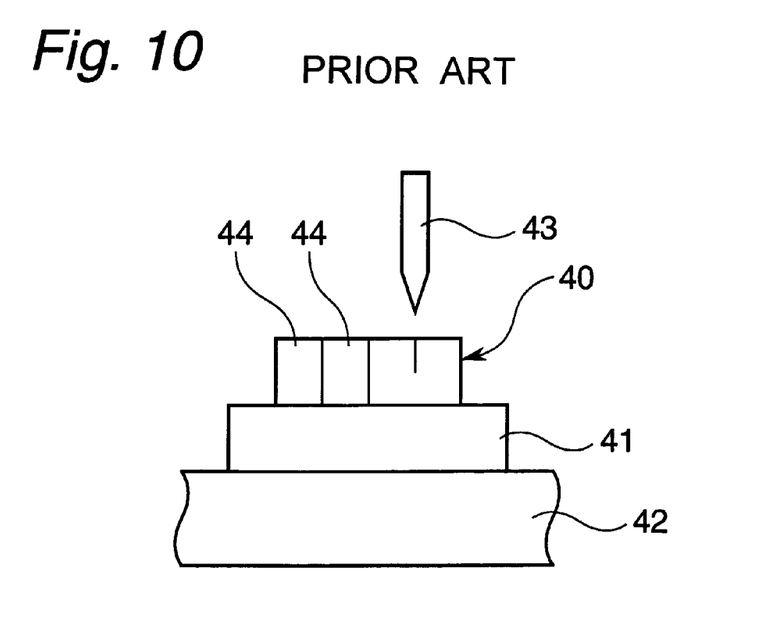
FIG. 10 is a sectional view showing the state of conventional semiconductor wafer being diced.

Referring to FIGS. 9 and 10, a semiconductor wafer 40 of, for example, silicon or gallium arsenide is produced in the form of a disk having a large diameter. This semiconductor wafer 40 is stuck through a pressure sensitive adhesive sheet 41 onto a ring frame 42. Subsequently, the semiconductor wafer 40 is cut apart into a multiplicity of dice formed chips 44 (dicing) by the use of a dicing saw 43. In this state, the semiconductor wafer is transferred to the subsequent steps such as cleaning, drying and die bonding steps. In this process, after the completion of the dicing step, the pressure sensitive adhesive sheet 41 is drawn outward by appropriate means so that the spacings of the mutually neighboring chips 44 are expanded.

It is desired that the conventional pressure sensitive adhesive sheet 41 have satisfactory adhesive strength to the chips 44 from the dicing step in which the wafer is cut apart into dice formed chips through the drying step. Further, referring to FIG. 11, it is desired that, in picking up the chips from the pressure sensitive adhesive sheet 41, the adhesive strength be such that no residue of pressure sensitive adhesive is attached to the chips 44.

Figure 11:
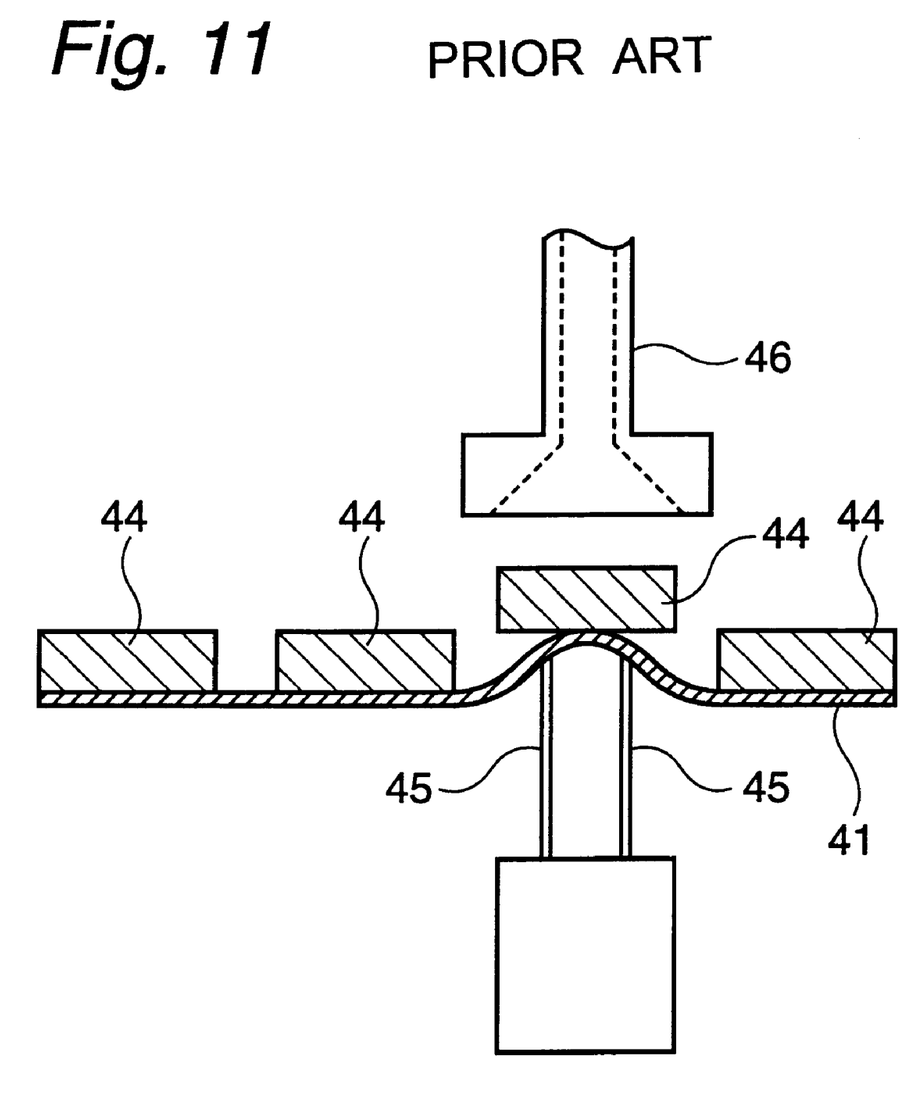
FIG. 11 is a schematic view depicting the state of conventional semiconductor wafer chips being picked up.

Various pressure sensitive adhesive sheets of the above type have been proposed in, for example, Japanese Patent Laid-open Publication Nos. 60(1985)-196956 and 60(1985)-223139. Further, in recent years, pressure sensitive adhesive sheets in which a UV curable pressure sensitive adhesive is used for reducing the adhesive strength at the time of pick-up have been proposed. However, the conventional pressure sensitive adhesive sheets 41 have a drawback in that, in the use thereof, it is difficult to realize uniform spacings between the chips 44 at the stage of expanding the chip spacings, thereby causing a spacing dispersion, with the result that the processing at each step encounters disorders. Further, bringing the adhesive strength at pick-up (vertical peeling strength) to complete nil is practically unfeasible, and the reduction of the vertical peeling strength at pick-up has encountered a limit of about 100 to 300 g/10 mm$^2$. Therefore, at the die bonding step at which a pick-up is carried out, the pressure sensitive adhesive sheet 41 must be forcibly pushed up from the back thereof with the use of a push-up needle 45. Therefore, there are disorders such as damaging of the chips 44 or migration of, for example, the pressure sensitive adhesive which adheres to the push-up needle 45 to the back of the chips 44.

Still further, the pressure sensitive adhesive sheet in which a UV curable pressure sensitive adhesive is used has not yet reached a stage such that all the chips 44 can be peeled without the need to use the push-up needle 45. The present applicants have proposed a technique in which the area of adhesion and the adhesive strength between the chips and the sheet are reduced by the use of a shrink film which can be shrunk by heating in place of the pressure sensitive adhesive sheet in which a UV curable pressure sensitive adhesive is used.

The present invention has been made with a view toward resolving the above problems of the prior art. The present invention provides a method of die bonding electronic components, in which use is made of a shrink film capable of expanding the chip spacings by a mechanism that is radically different from that of the conventional expansion method to thereby enable effective bonding without damaging the chips. The present invention also provides a die bonding apparatus therefor.

SUMMARY OF THE INVENTION

In one aspect of the present invention, there is provided a method of die bonding electronic components, comprising the steps of:

providing a dicing tape comprising at least one layer of shrink film and a pressure sensitive adhesive layer;

mounting a wafer on the dicing tape so that the wafer is stuck thereto by the pressure sensitive adhesive layer;

dicing the wafer so that the wafer is cut apart into a multiplicity of chips;

disposing the dicing tape having the multiplicity of chips stuck thereto on a table equipped with heating means, and shrinking the shrink film forming part of the dicing tape by the heating means so that an area of adhesion and adhesive strength between the chips and the adhesive layer are decreased and so that the chips are arranged with predetermined spacings; and suctioning the chips arranged with predetermined spacings one at a time by a suction collet disposed above the chips so that the chips are separated from each other.

This method enables arranging the multiplicity of chips with substantially uniform spacings without the need to conduct the conventional expansion step including drawing outward.

In this method, it is preferred that, in the step of shrinking the at least one layer of shrink film, only a peripheral region of the dicing tape where the multiplicity of chips are not stuck is heated as a first stage to thereby form a first shrunk part, and, thereafter, an inner region of the dicing tape where the chips are stuck is heated as a second stage to thereby form a second shrunk part, this second shrunk part forming stage conducted so that the multiplicity of chips, neighboring each other, are arranged with predetermined spacings, this second shrunk part forming stage followed by the sucking of the multiplicity of chips cut apart one at a time by the suction collet disposed above the chips so that the chips are separated from each other.

By virtue of the above, the conventional expansion can be avoided and the loosing of the dicing tape can be prevented.

The heating means can be disposed on an entire lower surface of the dicing tape or partially on a lower surface of the dicing tape. In the case of the latter partial disposition, it is preferred that the heating means is capable of moving along a horizontal direction synchronously with the suction collet.

Further, the heating means can be arranged so as to be movable in a vertical direction.

Still further, it is preferred that the dicing tape having the multiplicity of chips stuck thereto is disposed through a ring frame on the table, the heating means is arranged on a lower surface of the dicing tape, the chips are heated by the heating means, and the heating means is removed from the lower surface of the dicing tape, followed by the sucking of the multiplicity of chips cut apart one at a time by the suction collet disposed above the chips so that the chips are separated from each other.

By virtue of the above, not only can the dicing tape having the chips mounted thereon easily be carried onto the table but also the chips can be placed under suction one at a time and separated from each other.

Moreover, it is preferred that the dicing tape having the multiplicity of chips stuck thereto is stuck onto a ring frame, this ring frame is provided with at least two positioning notches at a predetermined distance, and pins corresponding to the notches are protrudently provided on the table at a predetermined distance, and the notches of the ring frame are fitted to the pins so that the ring frame is positioned on the table. As a result, the chip positioning on the table is facilitated.

In another aspect of the present invention, there is provided an apparatus for die bonding electronic components characterized in that a multiplicity of diced chips are stuck on a dicing tape which is composed of at least one layer of shrink film and a pressure sensitive adhesive layer, said dicing tape is stuck to a ring frame, said ring frame is disposed on a table which is equipped with heating means, a suction collet is disposed above said ring frame and is movable in a vertical direction, and said multiplicity of diced chips arranged with predetermined spaces are suctioned and separated one by one after said dicing tape is heated by said heating means.

In this apparatus, it is preferred that the ring frame is provided with at least two notches at a predetermined distance, and at least two positioning pins are protrudently disposed on the table equipped with heating means at a predetermined distance, the pins and the notches of the ring frame adapted to be fitted together so that the ring frame has a posture arranged in an appropriate position on the table. The posture arranged in an appropriate position is fixed by means of a vacuum suction pad, a magnet, or a similar device.

This apparatus enables the chips to be picked-up easily without the need to use a push-up needle.

DETAILED DESCRIPTION OF THE INVENTION

The method of die bonding electronic components according to the present invention and forms (working examples) of the die bonding apparatus of the present invention used in the method will be described below with reference to the appended drawings.

Figure 1:
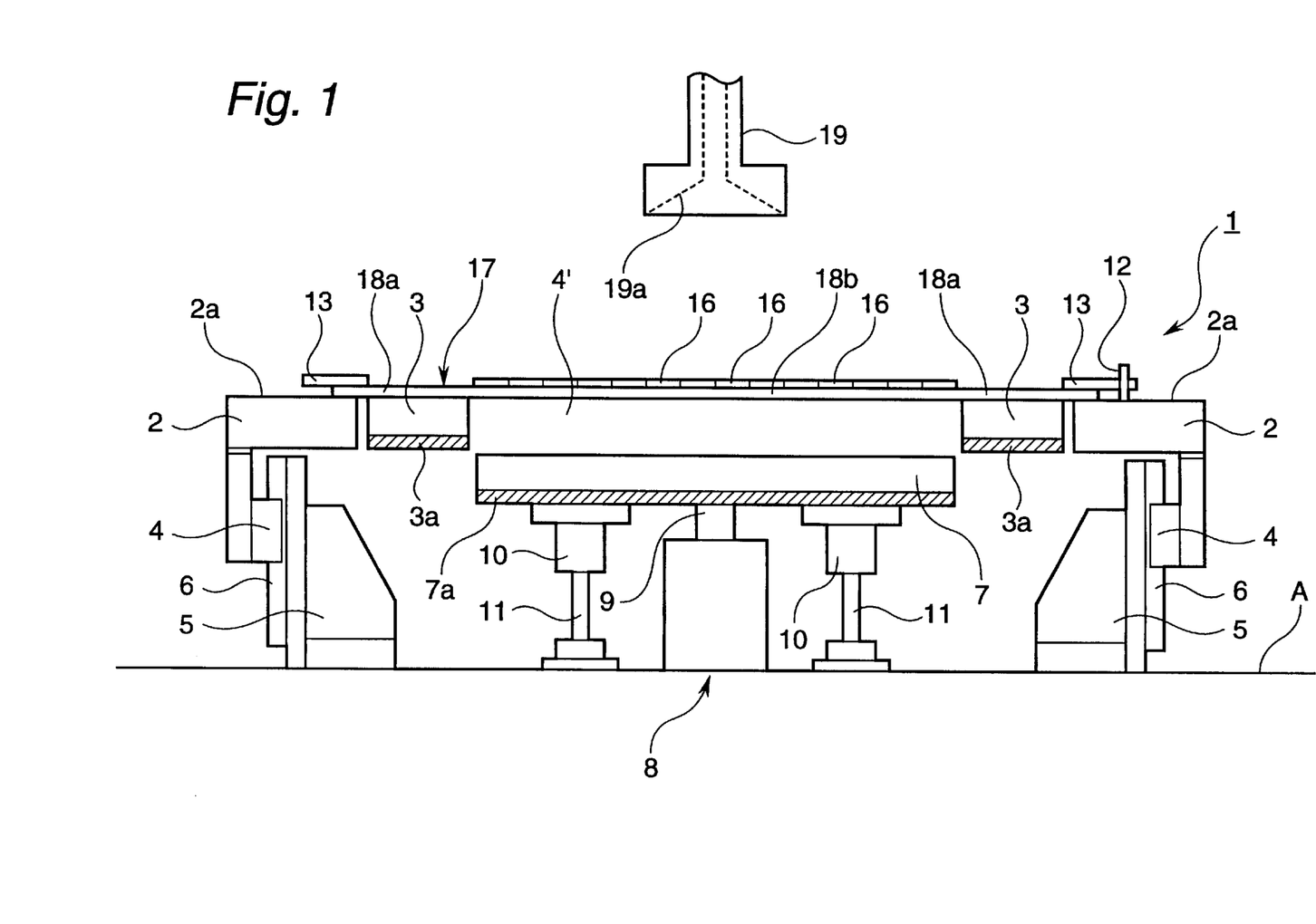
FIG. 1 is a side elevation sectional view of a first form of die bonding apparatus according to the present invention.

In FIG. 1, numeral 1 denotes a die bonding apparatus of the present invention as a whole. The die bonding apparatus 1 includes a ring-shaped fixing table 2 which constitutes a mounting table. A ring-shaped peripheral heater table 3 which constitutes a first heating means is arranged by the internal-circular-surface side of the fixing table 2 and secured to the fixing table 2.

The fixing table 2 at two points of the peripheral side of the lower edge thereof is fitted with downward extending guide members 4. These guide members 4 are formed so as to vertically slide on a guide rail 6 disposed on a frame 5 fixed to a base or floor A. Thus, by virtue of this construction, the guide members 4 vertically slide on the guide rail 6 by the functioning of a drive motor or cylinder mechanism (not shown), so that the fixing table 2 can vertically move along with the peripheral heater table 3.

In this construction, the guide members 4 are provided at two points of the peripheral side of the lower edge of the fixing table 2. However, for ensuring vertical movement of the fixing table 2 without inclination, it is preferred that at least three points of the lower edge of the fixing table 2 are fitted with the guide members 4. The mechanism for sliding the guide members 4 on the guide rail 6 is not particularly limited, and, for example, the conventional means comprising disposing ball bushes in the guide members 4 can be employed.

By the internal-circular-surface side of the peripheral heater table 3, a disk-shaped internal heater table 7 which can vertically move and constitutes a second heating means is arranged in a cavity 4' provided by the internal-circular-surface side of the peripheral heater table 3. That is, ball bushes 10 are secured to at least two points of the peripheral side of the lower edge of the internal heater table 7. Shafts 11 secured to the base or floor A are inserted in the ball bushes 10 in a manner such that the shafts 11 can vertically slide. An upper end of a piston 9 of a cylinder mechanism 8 fixed to the base or floor A is secured to the center of the lower edge of the internal heater table 7. Thus, the internal heater table 7 can be vertically moved by operating the cylinder mechanism 8.

The heating means of the peripheral heater table 3 and the internal heater table 7 are not particularly limited, and, for example, common heating means such as a sheath heater arranged in the table or a rubber heater can be employed. Heat insulating materials 3a, 7a such as those of polyether ether ketone are stuck to the lower surfaces of the peripheral heater table 3 and the internal heater table 7 for excluding heat.

Figure 2:
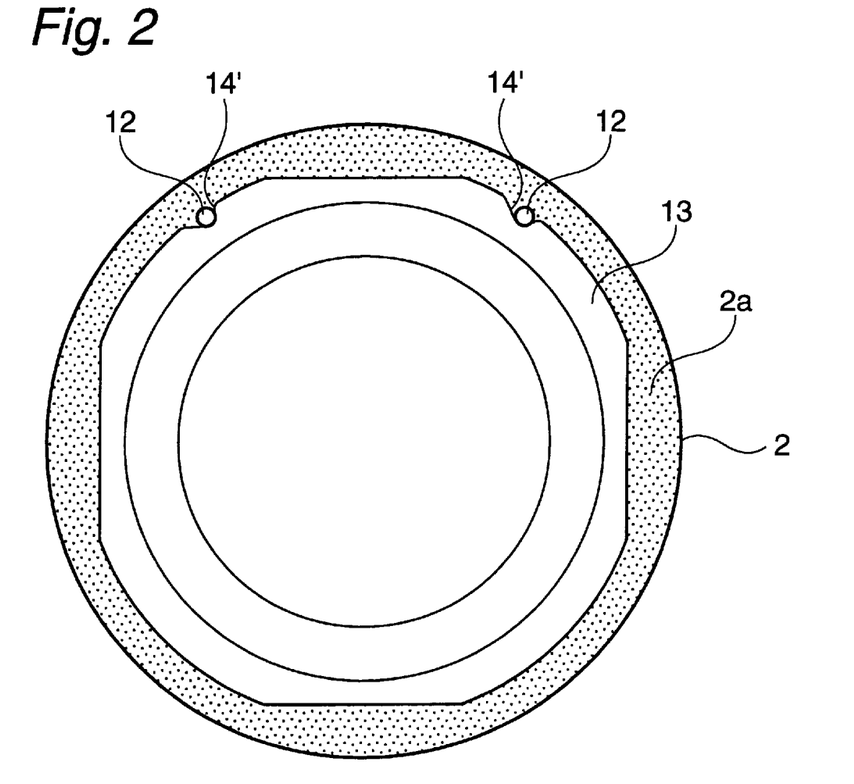
FIG. 2 is a partial top plan view of the die bonding apparatus of FIG. 1.
Figure 3:
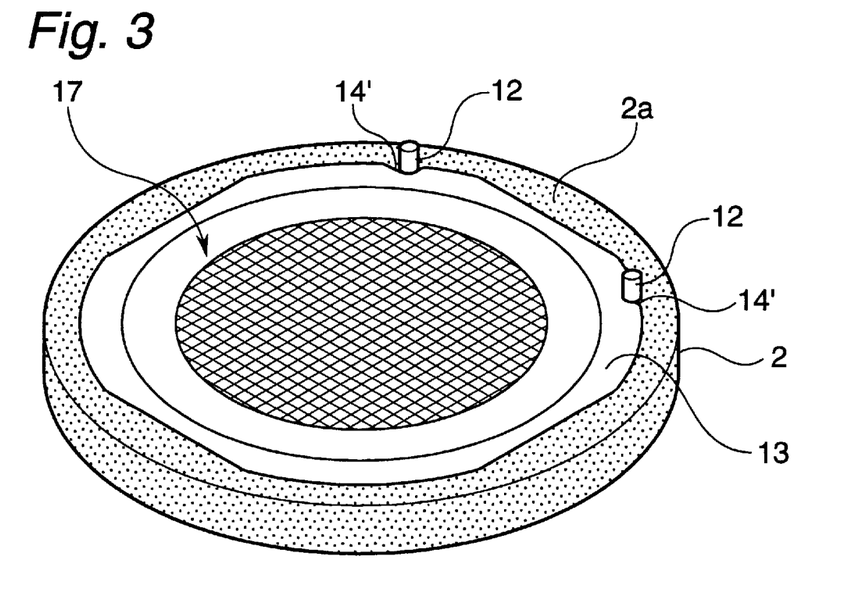
FIG. 3 is a partial perspective view of the die bonding apparatus of FIG. 1.

On the other hand, two positioning pins 12,12 are protrudently disposed on the upper surface 2a of the fixing table 2 at a predetermined distance, and a substantially ring-shaped ring frame 13 has positioning notches 14',14' formed at predetermined positions. Thus, such a structuring is realized that, in the mounting of the ring frame 13 on the upper surface 2a of the fixing table 2, positioning at a desired site can be made by fitting together the positioning notches 14',14' of the ring frame 13 and the positioning pins 12,12 of the fixing table 2. Thereafter, the structure is fixed by means of a vacuum suction pad, a magnet, etc.

The ring frame 13 is stuck to the periphery of a dicing tape 17 by a pressure sensitive adhesive layer 22 of the dicing tape 17, and a disk-shaped wafer 14 is stuck to the center of the circular dicing tape 17 by the pressure sensitive adhesive layer 22 of the dicing tape 17. This wafer 14 is in the form of a multiplicity of separate dice-shaped chips 16 for which a cutting has been conducted in the preceding wafer dicing step. Thus, the dicing tape 17 having the multiplicity of chips 16 stuck thereto is stuck to the ring frame 13.

In this embodiment, such a structuring is effected that, in the mounting of the ring frame 13 to which the dicing tape 17 having the multiplicity of chips 16 stuck thereto has been stuck on a predetermined position of the upper surface 2a of the fixing table 2, the peripheral heater table 3 is arranged under part 18a of the dicing tape 17 where no chips 16 are stuck while the internal heater table 7 is arranged under part 18b of the dicing tape 17 where chips 16 are stuck.

Moreover, a suction collet 19 which can move both vertically and horizontally is arranged above the internal heater table 7 in order to suck and separate the chips 16 of the dicing tape 17. The chips 16 mounted on the dicing tape 17 are placed under suction and separated chip after chip by the functioning of a vacuum pump (not shown). The inside of the suction collet is provided with a taper 19a, so that the suction collet contacts only the peripheral side of the chips 16 and does not contact major surfaces of the chips 16 to thereby prevent damaging of the chips 16. Further, this suction collet 19 is not particularly limited, and, for example, a suction collet with pad can be employed.

Figure 4:
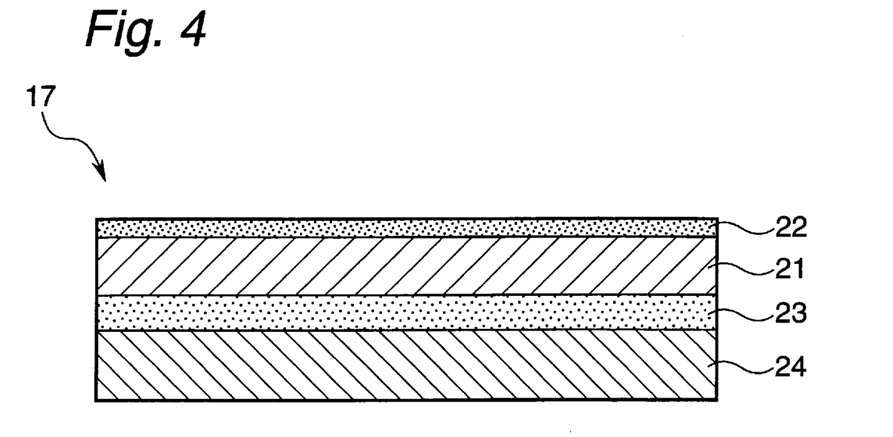
FIG. 4 is a partial enlarged sectional view of a dicing tape used in the present invention.
Figure 5:
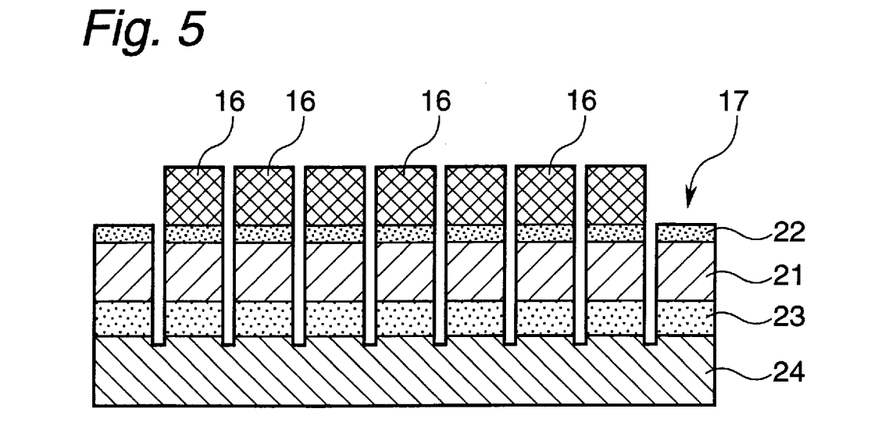
FIG. 5 is a schematic sectional view showing the dicing of a semiconductor wafer.

On the other hand, with respect to the dicing tape 17 used in this apparatus, preferred use is made of a dicing tape 17 comprising a shrink film 21, a pressure sensitive adhesive layer 22 superimposed on the upper surface of the shrink film 21 and a nonshrinkable film 24 stuck through an adhesive layer 23 to the lower surface of the shrink film 21, as shown in FIG. 4. Although the dicing tape 17 may be composed of a single layer of shrink film without the use of the nonshrinkable film 24, it is preferred to be a plastic film substrate composed of a plurality of layers. That is, it may be a single shrink film or a combination of at least two types of shrink films, or may be a combination of a shrink film and a nonshrinkable film.

The pressure sensitive adhesive layer 22 is not particularly limited, and, for example, it can be composed of rubbers, acrylic, silicones, polyvinyl ether, radiation curable or heating foamable type pressure sensitive adhesives. Preferred use is made of ultraviolet curable pressure sensitive adhesives. Ultraviolet permeable polyethylene terephthalate film with a thermal shrinkage ratio of 30 to 80% is especially preferably used as the shrink film 21.

Common general-purpose adhesives capable of joining the shrink film 21 and the nonshrinkable film 24 are used as the adhesive layer 23. Examples thereof include pressure sensitive adhesives of acryls, rubbers, silicones and the like and thermoplastic or thermosetting adhesives of polyesters, polyamides, ethylene copolymers, epoxies, urethanes and the like. Of these, acrylic pressure sensitive adhesives are especially preferred.

Although the nonshrinkable film 24 is not particularly limited, it is preferably composed of materials having excellent water and heat resistances. Examples thereof include polyolefin films such as a polyethylene film, a polypropylene film, a polybutene film and a polymethylpentene film, a polyvinyl chloride film, a polyethylene terephthalate film, a polybutylene terephthalate film, a polybutadiene film, a polyurethane film and an ethylene/vinyl acetate film. Also, use can be made of films of polymers containing a carboxyl group having compound as a polymer structural unit and laminates comprising these films and common general-purpose polymer films. Especially preferred material is an ultraviolet permeable polyethylene or polyethylene terephthalate. The dicing tape 17 after the dicing together with the ring frame 13 is held by a robot arm, and the ring frame 13 is mounted on the upper surface 2a of the fixing table 2 by fitting together the positioning notches 14',14' provided at predetermined positions of the ring frame 13 and the positioning pins 12,12 of the fixing table 2. Simultaneously with this operation, the internal heater table 7 is moved to the position at an upper level by means of the cylinder mechanism 8.

Thereafter, only part 18a of the dicing tape 17 where no chips 16 are stuck is heated at 80 to 150° C. and shrunk by operating the peripheral heater table 3. This is because simultaneous heating of all the parts would unfavorably cause loosing of the dicing tape and would render the spacings of the chips 16 nonuniform. As a result, the suction by means of the suction collet 19 would become difficult.

Subsequently, only part 18b of the dicing tape 17 where the chips 16 are stuck is heated at 80 to 150° C. by operating the internal heater table 7 to thereby shrink the shrink film 21.

Figure 6:
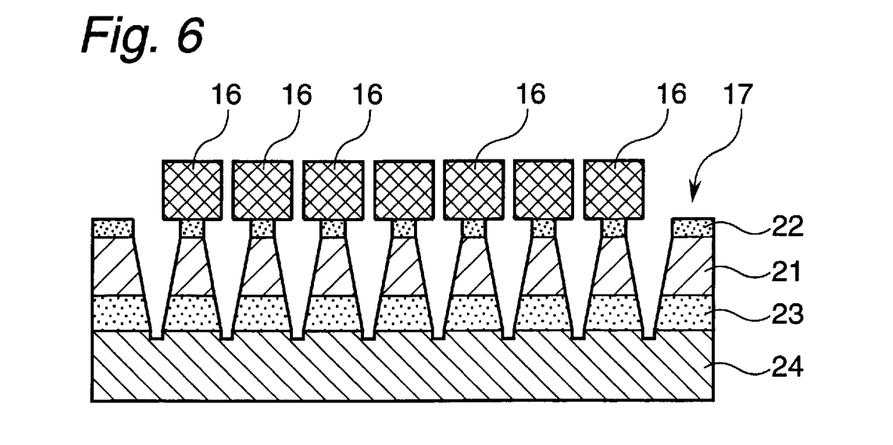
FIG. 6 is a schematic sectional view showing the thermal shrinkage of a dicing tape having semiconductor wafer chips stuck thereto.

This shrinkage of the shrink film 21 is accompanied by the deformation of the pressure sensitive adhesive layer 22 superimposed thereon, so that the area of adhesion between the chips 16 and the pressure sensitive adhesive layer 22 is reduced (see FIG. 6). As a result, the adhesive strength (vertical peeling strength) between the chips 16 and the pressure sensitive adhesive layer 22 is reduced, so that the chips 16 can easily be picked up only by the suction collet 19 without the need to use the conventional push-up needle.

When the pressure sensitive adhesive layer 22 is composed of an ultraviolet curable pressure sensitive adhesive, it is especially preferred that the pressure sensitive adhesive layer 22 is irradiated with ultraviolet rays prior to or after the above shrinkage. Whereby the pressure sensitive adhesive layer is cured so that the adhesive strength is reduced. The curing of the pressure sensitive adhesive layer enables a further reduction of the vertical peeling strength to thereby not only facilitate the pick up of the chips 16 but also prevent damaging of the chips 16.

After the shrink film 21 is shrunk by the above heating by the internal heater table 7, the internal heater table 7 is descended to a lower position by the cylinder mechanism 8. This is because positioning the dicing tape 17 on the internal heater table 7 until all the chips are transferred would cause the dicing tape 17 to suffer from loosening by remaining heat and would be detrimental to the performance of the chips 16.

Thereafter, the chips 16 are individually suctioned and transferred by, after detecting the position of chip 16 by means of a sensor or the like, moving the suction collet 19 horizontally, effecting a positioning thereof and descending the suction collet 19. In this instance, the use of the conventional push-up needle is not needed, so that damaging of the chips 16 and sticking of the pressure sensitive adhesive to the lower surface of the chips 16 can be avoided. In the suctioning by the suction collet 19, it is desirable that the guide members 4 are vertically sliding on the guide rails 6 by the functioning of the drive motor or cylinder mechanism and thus the fixing table 2 is vertically moving along with the peripheral heater table 3, whereby the suctioning by the suction collect is facilitated.

In this embodiment, the peripheral heater table 3 is secured to the fixing table 2. It is preferred that the fixing table 2 is so constructed as to be vertically movable separately from the peripheral heater table 3 and that, after the heating by means of the peripheral heater table 3, the fixing table 2 is elevated and whereby the peripheral heater table 3 is departed from the dicing tape 17. This is preferred from the viewpoint of preventing loosening of the dicing tape 17.

Further, in this embodiment, the chips 16 are individually placed under suction by, after detecting the position of chip 16 by means of a sensor such as a camera or the like, moving the suction collet 19 horizontally, effecting a positioning thereof and sinking the suction collet 19. However, the suctioning may be performed by moving the fixing table 2 in both horizontal and vertical directions, while the suction collet 19 remains stationary.

Figure 7:
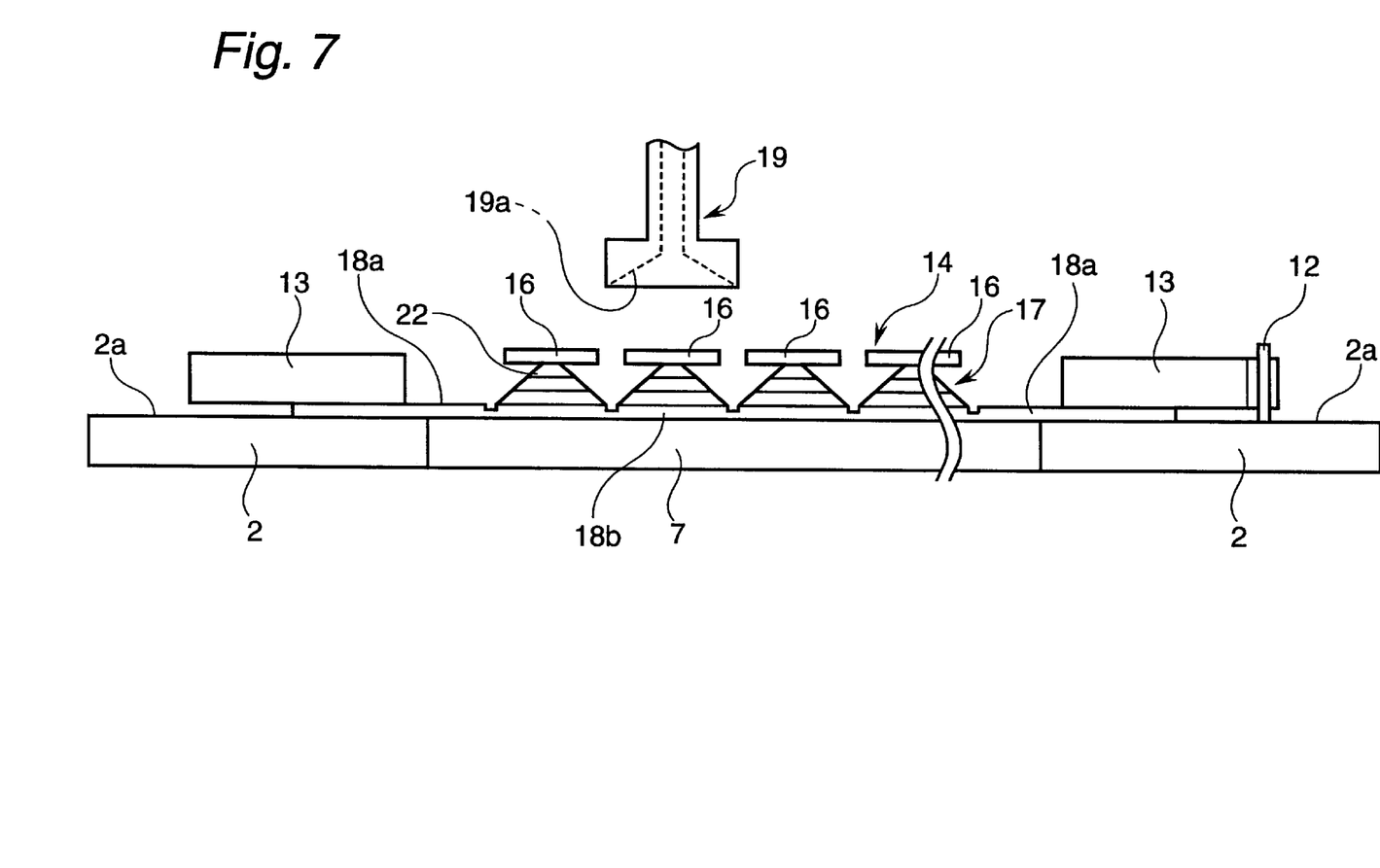
FIG. 7 is a side elevation sectional view of a second form of die bonding apparatus according to the present invention.

FIG. 7 is a sectional view of a second form of die bonding apparatus according to the present invention.

The construction of this form of die bonding apparatus is fundamentally the same as that of the first form of die bonding apparatus, except that the peripheral heater table 3 is omitted and only the internal heater table 7 is employed and that the fixing table 2 extends to the periphery of the internal heater table 7. Like structural members are denoted by like reference numerals, and the description is omitted.

In this embodiment as well, although not shown, the fixing table 2 at two points of the peripheral side of the lower edge thereof is fitted with the downward extending guide members 4, which are formed so as to vertically slide on the guide rails 6, so that the fixing table 2 can vertically move. Further, in this embodiment as well, an upper end of the piston 9 of the cylinder mechanism 8 is secured to the center of the lower edge of the internal heater table 7, so that the internal heater table 7 can be vertically moved by operating the cylinder mechanism 8.

In this form of die bonding apparatus, the dicing tape 17 is heated and shrunk once by the internal heater table 7. Therefore, the apparatus is slightly inferior to the first form of die bonding apparatus in respect of the uniformity of chip arrangement after shrinkage. However, this form of die bonding apparatus is also usable.

In both the above first embodiment and second embodiment, the internal heater table 7 is heated in its entirety. However, the internal heater table 7 can be heated in selected parts thereof so that the dicing tape 17 is partially heated and shrunk. Whereby, the chips 16 can be partially removed from the dicing tape 17 and suctioned by means of the suction collet 19.

Figure 8:
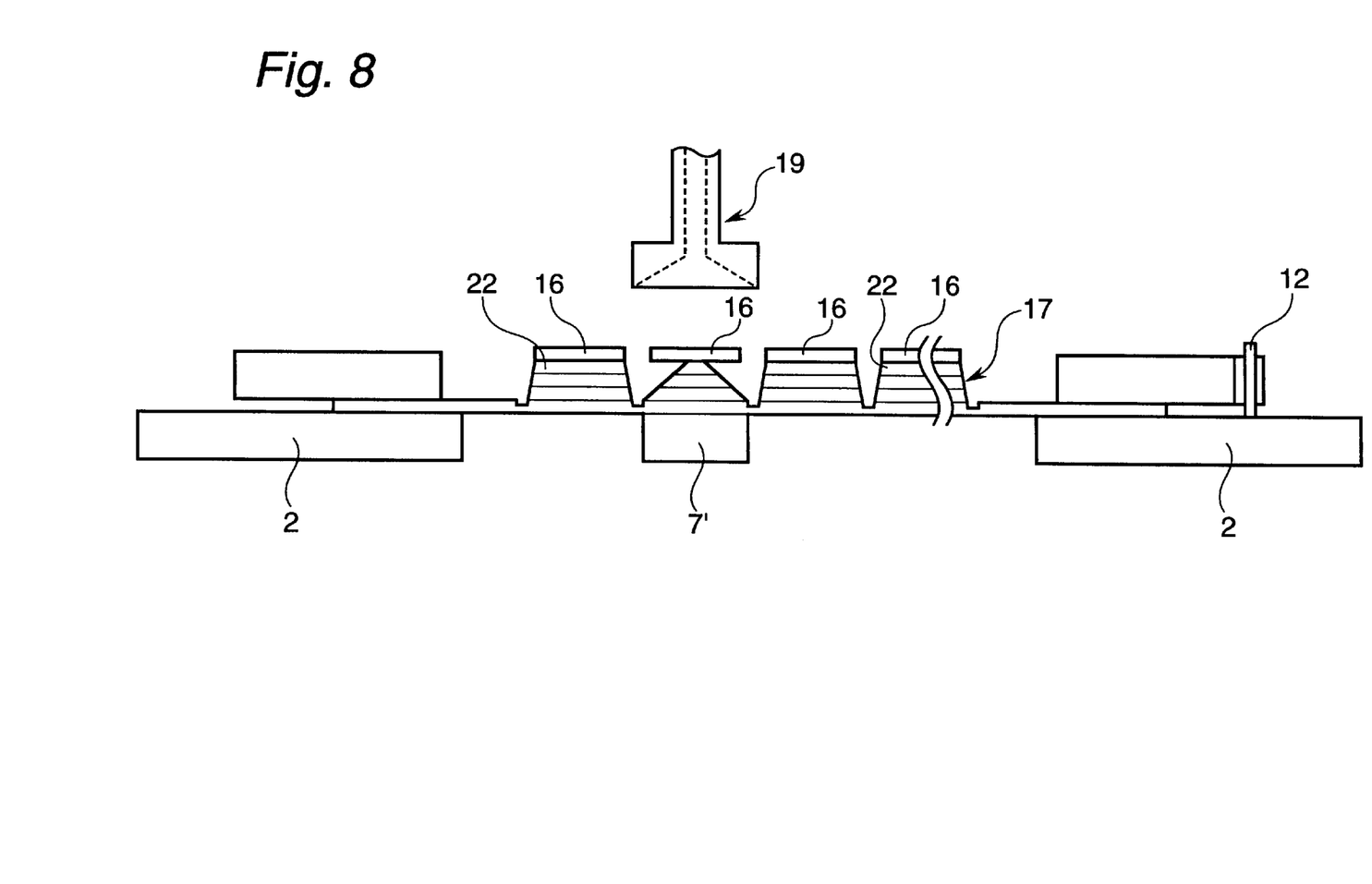
FIG. 8 is a side elevation sectional view of a third form of die bonding apparatus according to the present invention.

FIG. 8 is a sectional view of a third form of die bonding apparatus according to the present invention.

In this form of die bonding apparatus, the peripheral heater table 3 is omitted and the fixing table 2 is used alone. In addition, the internal heater table 7 is composed of a small heater table 7' having substantially the same size as that of each of the chips 16. The heater table 7' can move in both horizontal and vertical directions. Thus, the suction collet 19 is moved synchronously with the heater table 7' to just above the position of the chip 16 to be peeled which is heated and shrunk by the heater table 7'. After that, the chips 16 to be easily peeled off can be sucked individually by the suction collet 19.

Therefore, as compared with the first embodiment in which the dicing tape 17 is shrunk in its entirety, chip suction errors attributed to arrangement disorder can be reduced. Because the dicing tape 17 is heated and shrunk partially and whereby the peeling of the chips 16 is facilitated and the subsequent suction of the chips 16 can be performed one at a time by means of the suction collet 19.

The other construction depicted in FIG. 8 is fundamentally the same as in the first embodiment. Like structural members are denoted by like reference numerals, and the description is omitted. In this embodiment, the heater table 7' has substantially the same size as that of each of the chips 16. It is naturally feasible that the size of the heater table 7' is inconsistent with that of two chips or more and the heater table is heated in order to shrink part of the dicing tape 17 corresponding to the plurality of chips 16 once so that the peeling of the chips 16 is facilitated.

EFFECT OF THE INVENTION

In the method of die bonding electronic components and the die bonding apparatus therefor, according to the present invention, a dicing tape comprising at least one layer of shrink film and a pressure sensitive adhesive layer is used, and a wafer is stuck to the dicing tape. The wafer is diced so as to be cut apart into a multiplicity of chips. The dicing tape is mounted on a table equipped with heating means and shrunk by the heating means so that an area of adhesion and adhesive strength between the chips and the adhesive layer are decreased. Thereafter, the chips arranged with predetermined spacings are sucked one at a time by a suction collet disposed above the chips so that the chips are separated from each other. By virtue of this construction, the following peculiar and conspicuous functions and effects can be exerted.

(1) By the mechanism which is radically different from the conventional expansion method, not only can the chip spacings be uniformly expanded (arranged) but also the area and strength of adhesion with the chips can be reduced. Therefore, the individual chips can be sucked and separated from each other without failure and that, further, damaging of chips at the pick-up or sticking of pressure sensitive adhesive to the lower surface of chips which would cause contamination and deteriorate performance can be prevented to thereby enable effective die bonding.

(2) The use of conventional push-up needle is not needed and the individual chips can be sucked and separated from each other with the use of the suction collet only. Thus, damaging of chips by the use of push-up needle can be avoided to thereby enhance device reliability. Furthermore, the replacement or repair of push-up needle is not needed to thereby extremely enhance operating efficiency.

(3) No push-up needle is used as different from the prior art, so that a table or other support can be disposed under the dicing tape. Therefore, slack of the dicing tape can be avoided even when the diameter of the wafer is increased and uniform chip spacings can be maintained.

(4) In the embodiment in which part of the dicing tape where no chips are stuck is first heated and shrunk and thereafter part of the dicing tape where chips are stuck is shrunk, loosing of the dicing tape can be avoided in the expansion step and the chips can be arranged with uniform spacings. As a result, the chips can be picked up individually with accuracy by the suction collet.

What is claimed is:

1. A method of die bonding electronic components, comprising the steps of:

providing a dicing tape comprising at least one layer of shrink film and a pressure sensitive adhesive layer;

mounting a wafer on the dicing tape so that the wafer is stuck thereto by the pressure sensitive adhesive layer;

dicing the wafer so that the wafer is cut apart into a multiplicity of chips;

disposing the dicing tape having the multiplicity of chips stuck thereto on a table equipped with heating means, and shrinking the shrink film forming part of the dicing tape by the heating means so that an area of adhesion and adhesive strength between the chips and the adhesive layer are decreased and so that the chips are arranged with predetermined spacings; and suctioning the chips arranged with predetermined spacings one at a time by a suction collet disposed above the chips so that the chips are separated from each other.

2. The method as claimed in claim 1, wherein, in the step of shrinking the at least one layer of shrink film, only a peripheral region of the dicing tape where the multiplicity of chips is not stuck is heated as a first stage to thereby form a first shrunk part, and, thereafter, an inner region of the dicing tape where the chips are stuck is heated as a second stage to thereby form a second shrunk part, this second shrunk part forming stage conducted so that the multiplicity of chips, neighboring each other, is arranged with predetermined spacings, this second shrunk part forming stage followed by the suctioning of the multiplicity of chips cut apart one at a time by the suction collet disposed above the chips so that the chips are separated from each other.

3. The method as claimed in claim 1, wherein the heating means is disposed on an entire lower surface of the dicing tape.

4. The method as claimed in claim 3, wherein the heating means is arranged so as to be movable in a vertical direction.

5. The method as claimed in claim 1, wherein the heating means is arranged on a lower surface of the dicing tape so that the heating means is movable along a horizontal direction, the heating means being capable of moving along a horizontal direction synchronously with the suction collet to thereby selectively heat small regions.

6. The method as claimed in claim 1, wherein the dicing tape having the multiplicity of chips stuck thereto is disposed through a ring frame on the table, the heating means is arranged on a lower surface of the dicing tape, the chips are heated by the heating means, and the heating means is removed from the lower surface of the dicing tape, followed by the suctioning of the multiplicity of chips cut apart one at a time by the suction collet disposed above the chips so that the chips are separated from each other.

7. The method as claimed in claim 1, wherein the dicing tape having the multiplicity of chips stuck thereto is stuck onto a ring frame, said ring frame is provided with at least two positioning notches at a predetermined distance, and pins corresponding to the notches are protrudently provided on the table at a predetermined distance, and the notches of the ring frame are fitted to the pins so that the ring frame is positioned on the table.

8. A system for die bonding electronic components, comprising:

a dicing tape which is comprised of at least one layer of shrink film and a pressure sensitive adhesive layer, wherein a multiplicity of diced chips is adhered to the dicing tape and arranged with predetermined spaces;

a ring frame having the dicing tape adhered thereto, wherein said ring frame is disposed on a table which is equipped with heating means; and a suction collet disposed above said ring frame and movable in a vertical direction, whereby said multiplicity of diced chips is suctioned by the suction collet and separated one by one after said dicing tape is heated by said heating means, wherein said dicing tape is shrunk by said heating means so that an area of adhesion and adhesive strength between the multiplicity of diced chips and the adhesive layer is decreased.

9. The apparatus as claimed in claim 8, wherein the ring frame is provided with at least two notches at a predetermined distance, and at least two positioning pins are protrudently disposed on the table equipped with heating means at a predetermined distance, the pins and the notches of the ring frame adapted to be fitted together so that the ring frame has a posture arranged in an appropriate position on the table.

10. The apparatus as claimed in claim 9, wherein the heating means is arranged on a lower surface of the dicing tape so that the heating means is movable along a horizontal direction, the heating means being capable of moving along a horizontal direction synchronously with the suction collet to thereby selectively heat small regions.

11. The apparatus as claimed in claim 9, wherein the heating means is arranged so as to be movable in a vertical direction.

12. The apparatus as claimed in claim 8, wherein the heating means is disposed on an entire lower surface of the dicing tape.

13. The apparatus as claimed in claim 8, wherein the dicing tape having the multiplicity of chips stuck thereto is disposed through the ring frame on the table, and wherein the table having the heating means is arranged under the dicing tape, to thereby enable heating the chips by the heating means and removing the heating means from the lower surface of the dicing tape, followed by the suctioning of the multiplicity of chips cut apart one at a time by the suction collet disposed above the chips so that the chips are separated from each other.

14. An apparatus for die bonding electronic components, comprising:

a dicing tape which is comprised of at least one layer of shrink film and a pressure sensitive adhesive layer, wherein a multiplicity of diced chips is adhered to said dicing tape and arranged with predetermined spaces;

a ring frame having the dicing tape adhered thereto, wherein said ring frame is disposed on a table which is equipped with heating means; and a suction collet disposed above said ring frame and movable in a vertical direction, whereby said multiplicity of diced chips is suctioned by the suction collet and separated one by one after said dicing tape is heated by said heating means, wherein said heating means includes:

a first heating means capable of heating only a peripheral region of the dicing tape where the multiplicity of chips is not adhered as a first stage in the step of shrinking the at least one layer of shrink film; and a second heating means capable of heating an inner region of the dicing tape where the multiplicity of diced chips is adhered as a second stage of the step.

* * * * *

UNITED STATES PATENT AND TRADEMARK OFFICE
CERTIFICATE OF CORRECTION

PATENT NO. : 6,176,966 B1
DATED : January 23, 2001
INVENTOR(S) : Masaki Tsujimoto et al.

It is certified that error appears in the above-identified patent and that said Letters Patent is hereby corrected as shown below:

Title page,
Item (54) In the Title, delete "THEREOF" and insert -- THEREFOR --.

Column 1,
Line 3, In the Title, delete "THEREOF" and insert -- THEREFOR --.

Signed and Sealed this

Twenty-fifth Day of September, 2001

Attest:

*Nicholas P. Godici*

NICHOLAS P. GODICI
*Attesting Officer*   Acting Director of the United States Patent and Trademark Office